United States Patent
Chen et al.

(10) Patent No.: US 8,455,982 B2
(45) Date of Patent: Jun. 4, 2013

(54) OVERLAY MARK ENHANCEMENT FEATURE

(75) Inventors: Meng-Wei Chen, Taichung (TW);
Chi-Chuang Lee, Chubei (TW);
Chung-Hsien Lin, Hsinchu (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 0 days.

(21) Appl. No.: 13/408,618

(22) Filed: Feb. 29, 2012

(65) Prior Publication Data
US 2012/0153441 A1 Jun. 21, 2012

Related U.S. Application Data

(62) Division of application No. 12/854,660, filed on Aug. 11, 2010, now Pat. No. 8,148,232.

(51) Int. Cl.
*H01L 29/06* (2006.01)
(52) U.S. Cl.
USPC .................. 257/618; 257/797; 257/E29.005
(58) Field of Classification Search
USPC ................................ 257/618, 797
See application file for complete search history.

(56) References Cited

U.S. PATENT DOCUMENTS

| | | |
|---|---|---|
| 6,330,355 B1 | 12/2001 | Chen et al. |
| 6,803,291 B1 | 10/2004 | Fu et al. |
| 6,838,217 B1 | 1/2005 | Chen et al. |
| 7,064,044 B2 | 6/2006 | Chen et al. |
| 7,419,882 B2 | 9/2008 | Wu et al. |
| 7,566,516 B2 | 7/2009 | Yang |
| 7,615,493 B2 | 11/2009 | Kim |
| 7,732,299 B2 | 6/2010 | Chang |
| 8,022,560 B2 * | 9/2011 | Chen et al. .................. 257/797 |
| 2005/0097764 A1 | 5/2005 | Kim |
| 2007/0194466 A1 * | 8/2007 | Yamaguchi ................ 257/797 |
| 2009/0023266 A1 | 1/2009 | Hatano |
| 2010/0203734 A1 | 8/2010 | Shieh et al. |
| 2011/0241119 A1 | 10/2011 | Chen et al. |

* cited by examiner

*Primary Examiner* — Savitr Mulpuri
(74) *Attorney, Agent, or Firm* — Haynes and Boone, LLP

(57) ABSTRACT

An integrated circuit device includes a semiconductor substrate having a device region and an alignment region. A first material layer is disposed over the semiconductor substrate, and includes a device feature in the device region and a dummy feature in the alignment region. A dimension of the dummy feature is less than a dimension of an alignment detector. A second material layer is disposed over the semiconductor substrate, and includes an alignment feature in the alignment region. The alignment feature disposed over the dummy feature.

10 Claims, 17 Drawing Sheets

OVERLAY MARK ENHANCEMENT FEATURE

The present patent is a divisional of U.S. Ser. No. 12/854,660 filed Aug. 11, 2010, the disclosure of which is hereby incorporated by reference.

BACKGROUND

The semiconductor integrated circuit (IC) industry has experienced rapid growth. Technological advances in IC materials and design have produced generations of ICs where each generation has smaller feature sizes and more complex circuits than those from the previous generation. Such IC devices are fabricated by patterning a sequence of patterned and un-patterned layers, and the features on successive patterned layers are spatially related to each other. During fabrication, each patterned layer must be aligned with the previous patterned layers with a degree of precision. Pattern alignment techniques typically provide an overlay mark to achieve alignment of successive layers. An exemplary overlay mark is a pattern forming a box (typically an open-centered box) used in a box-in-box (BIB) alignment technique. As device scaling continues, and multiple lithography processes are implemented for patterning a layer, overlay mark signals are becoming weaker, preventing precise alignment of the successive patterned layers. Accordingly, although existing alignment structures and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-8A are diagrammatic cross-sectional views of an integrated circuit device having a device region and an alignment region at various stages of fabrication according to the method of FIG. 1.

FIGS. 2B-8B are diagrammatic top views of the alignment region of the integrated circuit device illustrated in FIGS. 2A-8A, respectively.

DETAILED DESCRIPTION

Figure 1:
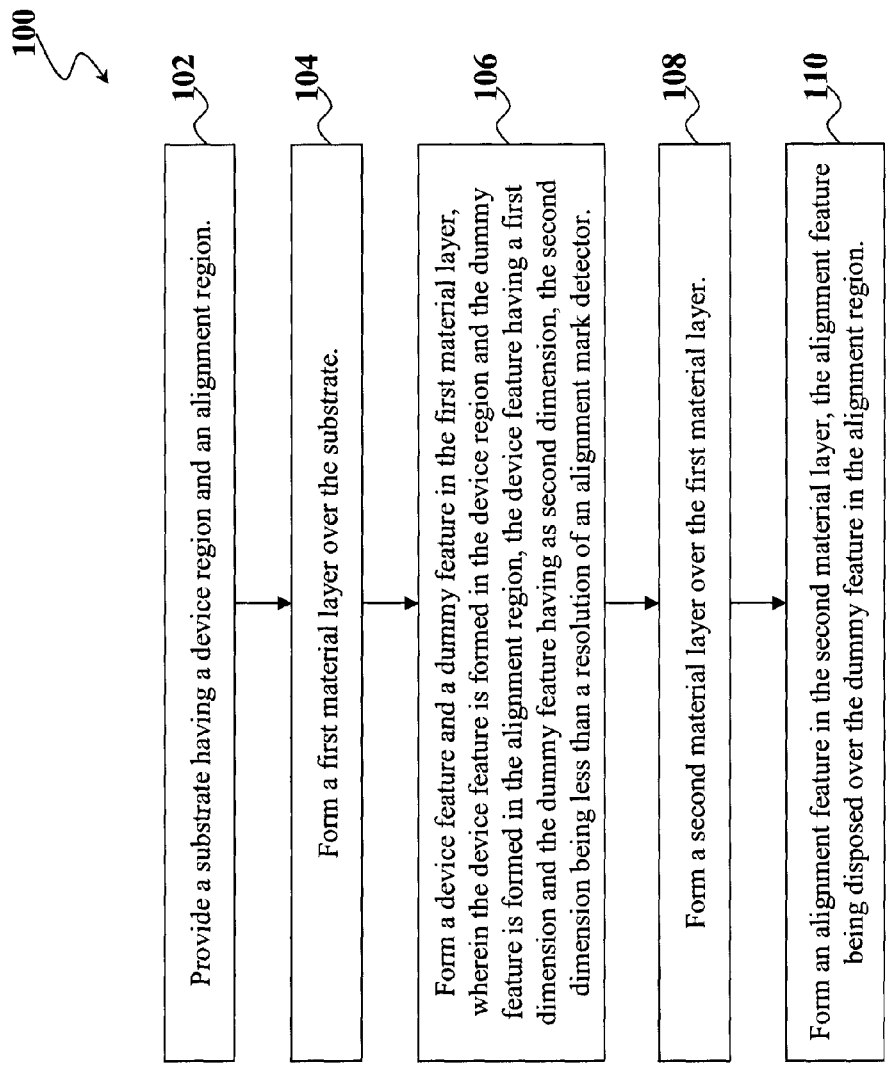
FIG. 1 is a flow chart of a method for fabricating an alignment structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flow chart of an embodiment of a method 100 for fabricating an alignment structure according to various aspects of the present disclosure. The method 100 begins at block 102 where a substrate having a device region and an alignment region is provided. At block 104, a first material layer is formed over the substrate. At block 106, a device feature and a dummy feature is formed in the first material layer. The device feature is formed in the device region, and the dummy feature is formed in the alignment region. The device feature has a first dimension, and the dummy feature has a second dimension. The second dimension is less than a resolution of an alignment mark detector. The method continues with block 108 where a second material is formed over the first material layer. At block 110, an alignment feature is formed in the second material layer. The alignment feature is disposed over the dummy feature in the alignment region. The alignment feature may be an inner box of a box-in-box (BIB) pattern recognition technique. Another alignment feature, such as an outer box of the BIB pattern recognition technique, may be formed in the substrate or a material layer between the substrate and the first material layer. Accordingly, the alignment feature in the second material layer may be evaluated in relation to the alignment feature in the substrate (or other material layer) to determine alignment of successive patterned layers. The alignment feature may also serve as the outer box of the BIB pattern recognition technique to align various patterned layers disposed above the second material layer. Additional steps can be provided before, during, and after the method 100, and some of the steps described can be replaced or eliminated for other embodiments of the method. The discussion that follows illustrates various embodiments of an alignment structure that can be fabricated according to the method 100 of FIG. 1.

FIGS. 2A-8A are diagrammatic cross-sectional views of an integrated circuit device 200 having a device region 204 and an alignment region 206 at various stages of fabrication according to the method of FIG. 1. FIGS. 2B-8B are diagrammatic top views of the alignment region 206 of the integrated circuit device 200 illustrated in FIGS. 2A-8A, respectively. FIGS. 2A-8A and FIGS. 2B-8B have been simplified for the sake of clarity to better understand the inventive concepts of the present disclosure. Additional features can be added in the integrated circuit device 200, and some of the features described below can be replaced or eliminated in other embodiments of the integrated circuit device 200.

As will be described in detail below, in the depicted embodiment, gate stacks of the integrated circuit device 200 will be formed in the device region 204, and alignment marks will be formed in the alignment region 206. A plurality of layers may be formed in the device region 204, such as active layers (OD layers, defining active areas of the device region), poly layers (PO layers, defining gate areas of the device region), contact layers (CO layers, defining contacts to the OD and POLY areas), N-well implant layers (NW layers), P-well implant layers (PW layers), P+ implant layers (PP layers), N+ layers (NP layers), metal layers (M1, M2, ... MN), transistor threshold adjustment implant layers (VT layers), and/or other suitable layers. The plurality of layers in the device region 204 form a variety of devices, including passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. The alignment region 206 may include various pattern recognition features, including alignment marks, overlay marks, other suitable alignment features, or combinations thereof.

Figure 2A:
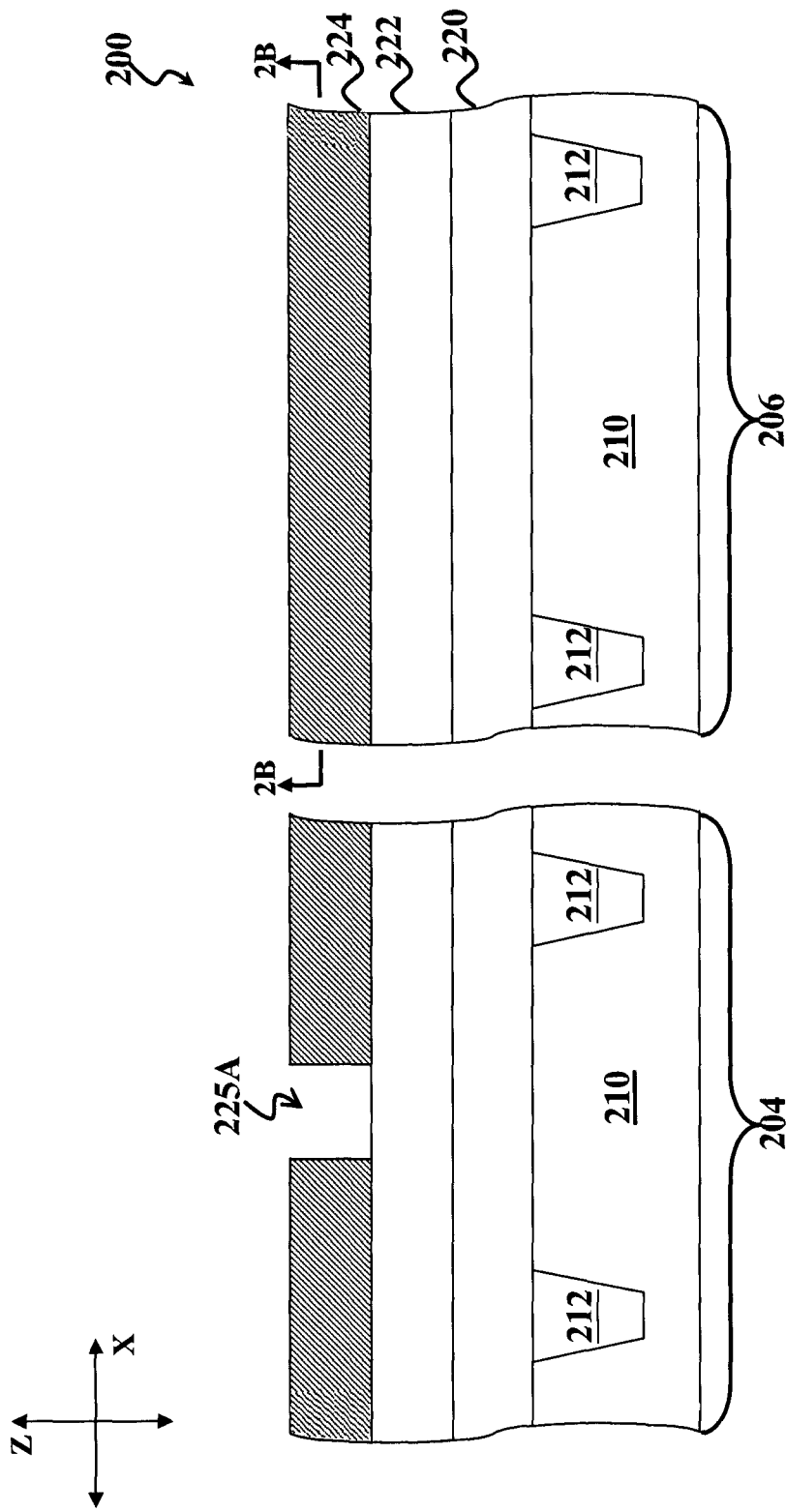

Referring to FIG. 2A, the integrated circuit device 200 includes a substrate 210. The substrate 210 is a semiconductor substrate, such as a silicon substrate. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

Isolation features 212 isolate various regions of the substrate 210, such as the device region 204 and the alignment region 206. In the depicted embodiment, the isolation features 212 in the device region 204 isolate various devices (not shown) from one another, and the isolation features 212 in the alignment region 206 form an alignment feature, which will be described in further detail below. The isolation features 212 utilize isolation technology, such as local oxidation of silicon (LOCOS), shallow trench isolation (STI), and/or deep trench isolation (DTI), to define and electrically isolate the various regions. The isolation features 212 include silicon oxide, silicon nitride, silicon oxynitride, other suitable materials, or combinations thereof. The isolation features 212 are formed by a suitable process. As one example, forming an STI can include a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

A gate layer 220 is disposed over the substrate 202 in the device and alignment regions 204 and 206. In the depicted embodiment, the gate layer 220 is a polysilicon layer, which will be patterned to define gate stacks of the integrated circuit device 200. The polysilicon layer may be doped for proper conductivity. Alternatively, the polysilicon is not necessarily doped if a dummy gate is to be formed and is replaced in a subsequent gate replacement process. Alternatively, the gate layer 220 could include a conductive layer having a proper work function, therefore, the gate layer can also be referred to as a work function layer. The work function layer comprises any suitable material, such that the layer can be tuned to have a proper work function for enhanced performance of the associated device. For example, if a P-type work function metal (P-metal) for a PMOS device is desired, TiN or TaN may be used. On the other hand, if an N-type work function metal (N-metal) for NMOS devices is desired, Ta, TiAl, TiAlN, or TaCN, may be used. The work function layer may include doped conducting oxide materials. The gate layer may include other conductive materials, such as aluminum, copper, tungsten, metal alloys, metal silicide, other suitable materials, and/or combinations thereof. For example, where the gate layer includes a work function layer, another conductive layer can be formed over the work function layer. The gate layer 220 is formed by a suitable deposition process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, or combinations thereof.

A hard mask layer 222 is disposed over the gate layer 220. In the depicted embodiment, the hard mask layer 222 is a polysilicon hard mask layer, for example, an oxide layer, such as silicon oxide. Alternatively, the hard mask layer 222 comprises silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, TEOS formed oxide, plasma enhanced oxide (PE oxide), high aspect ratio deposition process (HARP) oxide, other proper materials, or combinations thereof. The hard mask layer 222 is formed by a suitable deposition process, such as PVD, CVD, PECVD, RTCVD, ALD, MOCVD, other suitable processes, or combinations thereof. The hard mask layer 222 may include a single layer or multiple layers.

Figure 2B:
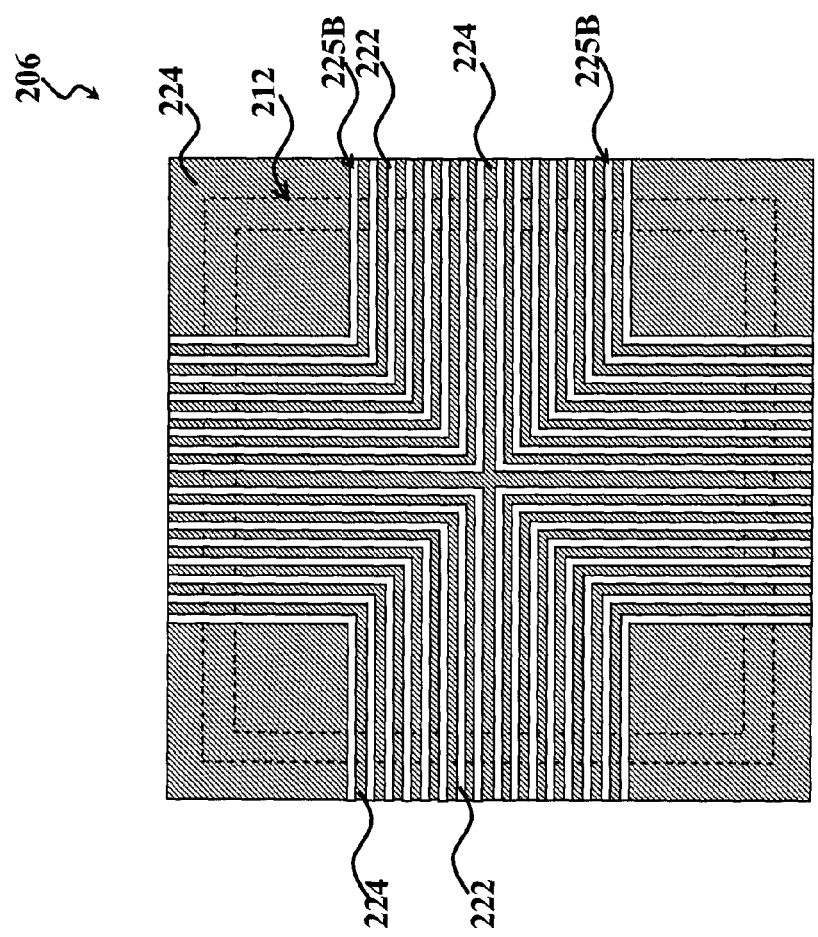
Figure 2B:
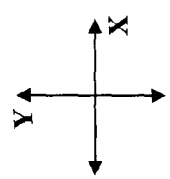
Figure 3A:
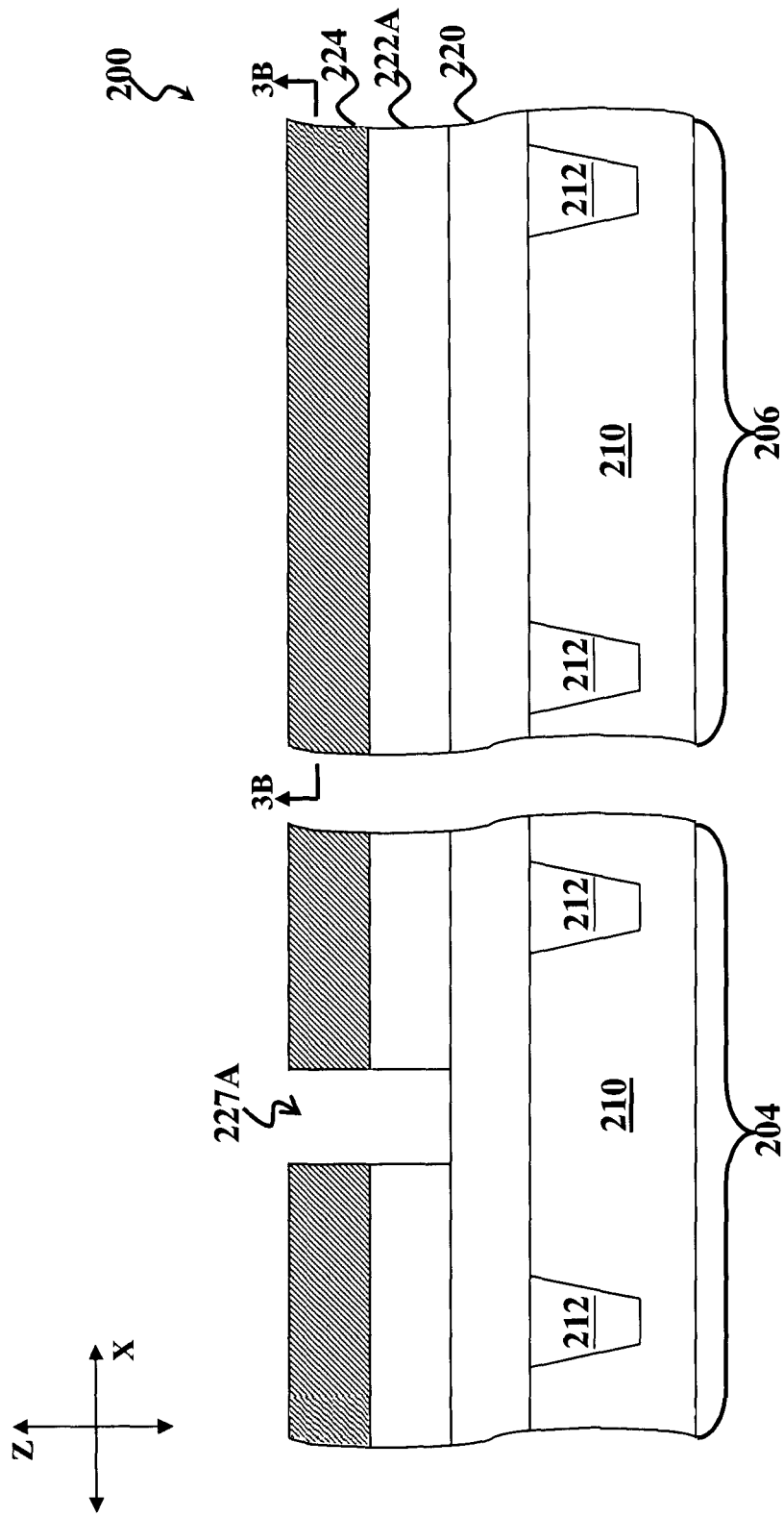
Figure 3B:
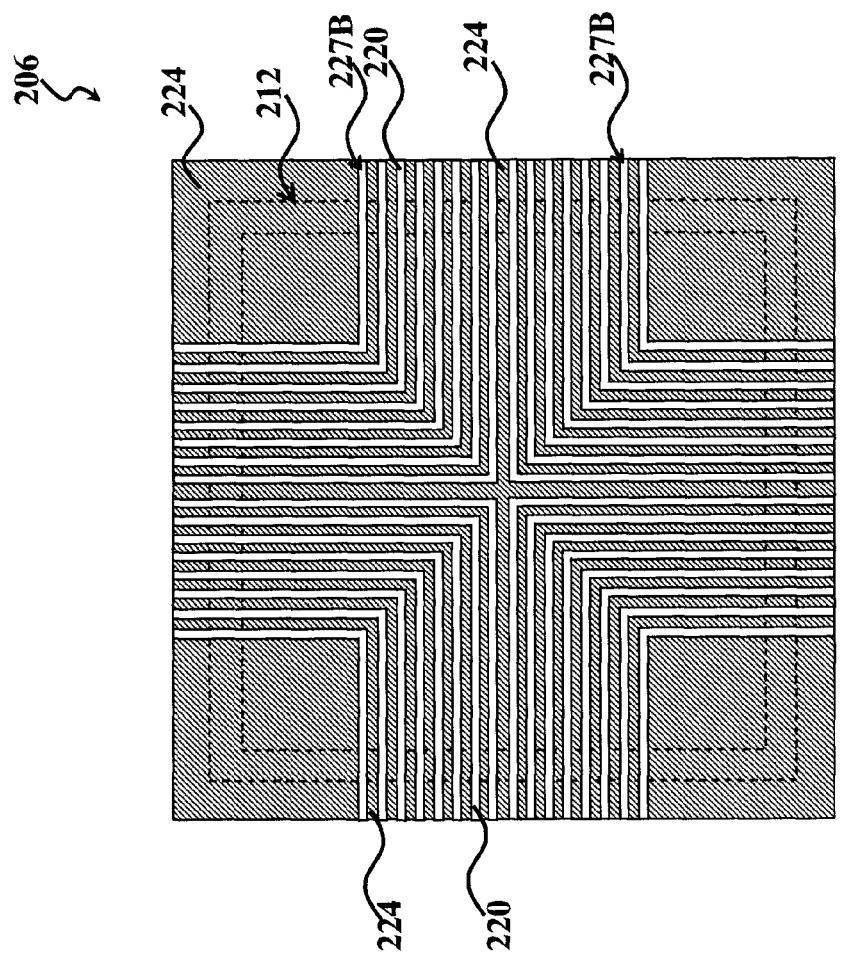
Figure 3B:
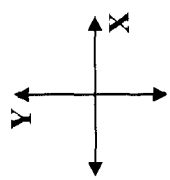

Referring to FIGS. 2A and 2B, a patterned photoresist layer 224 is disposed over the hard mask layer 222. The patterned photoresist layer 224 includes openings 225A in the device region 204 and openings 225B in alignment region 206, such that portions of the hard mask layer 222 are exposed within the openings 225A and 225B. The openings 225A and 225B are configured according to a predetermined pattern. For example, in the depicted embodiment, the patterned photoresist layer 224 defines gate lines that will be formed for the integrated circuit device 200. The patterned photoresist layer 224 may be a positive-type or negative-type photoresist layer. The patterned photoresist layer 224 is formed by a photolithography process, which may include processing steps of photoresist coating (such as spin-on coating), soft baking, mask aligning, exposing, post-exposure baking, developing, hard baking, other suitable processes, or combinations thereof. In an example, the exposing process includes exposing the photoresist layer 224 to a radiation beam through a mask having the predefined (or predetermined) pattern (or a reversed pattern). The radiation beam may use ultraviolet (UV) or extreme ultraviolet (EUV) radiation. Alternatively, the exposing process is implemented or replaced by other proper methods, such as maskless lithography, electron-beam (e-beam) writing, ion-beam writing, and/or molecular imprint techniques.

The patterned photoresist layer 224 is used as a mask to pattern the hard mask layer 222. For example, referring to FIGS. 3A and 3B, an etching process is performed to remove the portions of the hard mask layer 222 exposed within the openings 225A and 225B. The etching process is a dry etching process, wet etching process, other suitable etching process, or combinations thereof. The etching process extends the openings 225A and 225B into the hard mask layer 222, thereby forming openings 227A in the device region 204 and openings 227B in the alignment region 206. Portions of the gate layer 220 are exposed within the openings 227A and 227B. Thereafter, referring to FIGS. 4A and 4B, the patterned photoresist layer 224 is removed, for example, by a photoresist stripping process, leaving hard mask layer having a first pattern 222A. The hard mask layer having the first pattern 222A includes openings 229A in the device region 204 and openings 229B in the alignment region 206. The openings 229A and 229B of the hard mask layer having the first pattern 222A define device features in the device region 204 and dummy features in the alignment region 206. In the depicted embodiment, the device features define gate lines, and the dummy features are alignment mark enhancement features.

Figure 4A:
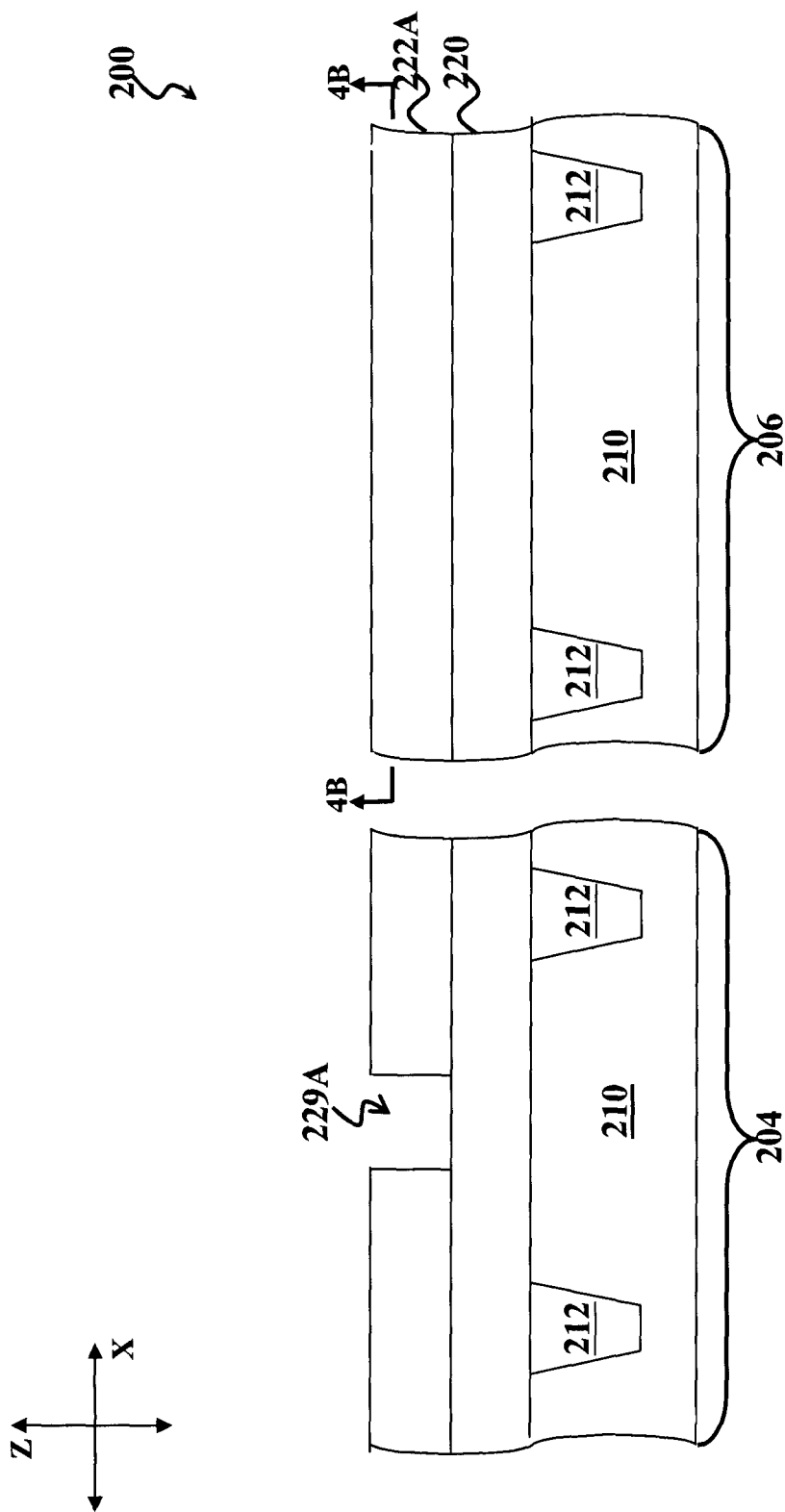
Figure 4B:
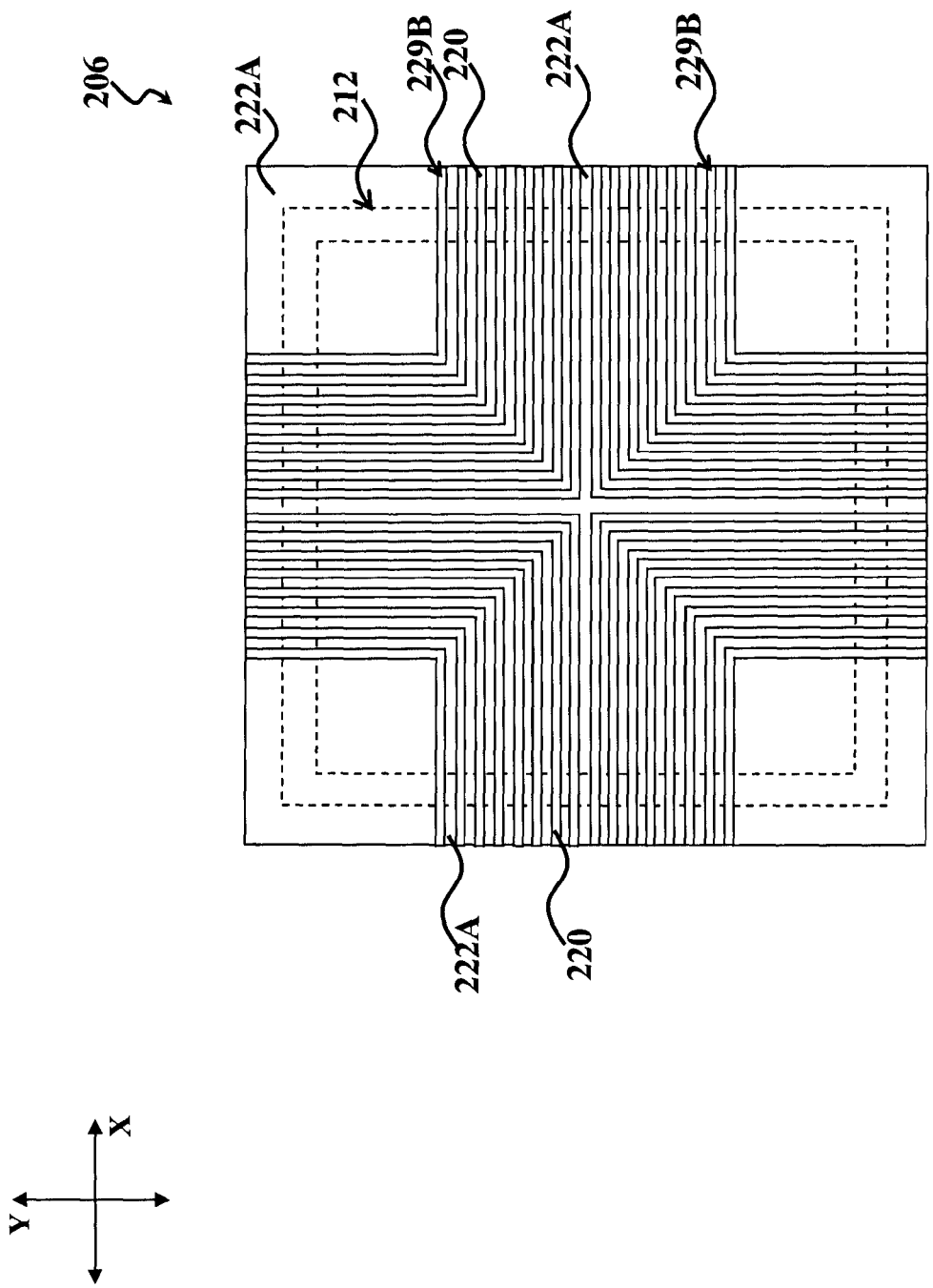

Referring to FIG. 4B, the dummy features include multiple segmented lines. In the depicted embodiment, the multiple segmented lines form an L-shape. The L-shape dummy features include a first portion of the hard mask layer 222A that extends in a first direction and a second portion of the hard mask layer 222A that extends in a second direction and traverses the first portion. The shape of the dummy features are not limited by the depicted embodiment, and the dummy features may include any shape, dimension, and/or configuration. A dimension of the dummy features is selected such that it is smaller than a resolution of an alignment detection system, such as an overlay measurement system. The alignment detection system can be a part of a lithography system used in fabricating an integrated circuit device. Having the sub-resolution dummy features ensures that the dummy features are not recognized by the alignment detection system, thereby maintaining pattern contrast and good measurement signals. For example, in the depicted embodiment, the resolution of an overlay measurement system may be approximately 0.35 µm. Accordingly, a width of the dummy features is less than about 350 nm. In an example, the width of the dummy features is less than about 100 nm and greater than about 36 nm. Alternatively, a dimension other than width is selected as smaller than the resolution of the alignment detection system.

In the depicted embodiment, the device features also include multiple segmented lines (not shown) similar to the dummy features formed in alignment region 206 by the hard mask layer having the first pattern 222A (FIG. 4B). The multiple segmented lines define various gate lines. In the depicted embodiment, the device features have different dimensions than the dummy features. For example, as noted above, the dummy features have a dimension, such as a width, that is a sub-resolution dimension. The device features also have a dimension, such as a width, where the dimension of the device feature is larger than the dimension of the dummy features. Accordingly, the dummy features and device features may have the exact same configuration and/or shape, but have different dimensions, the dummy features being smaller than the device features, such that the dummy features are sub-resolution.

Figure 5A:
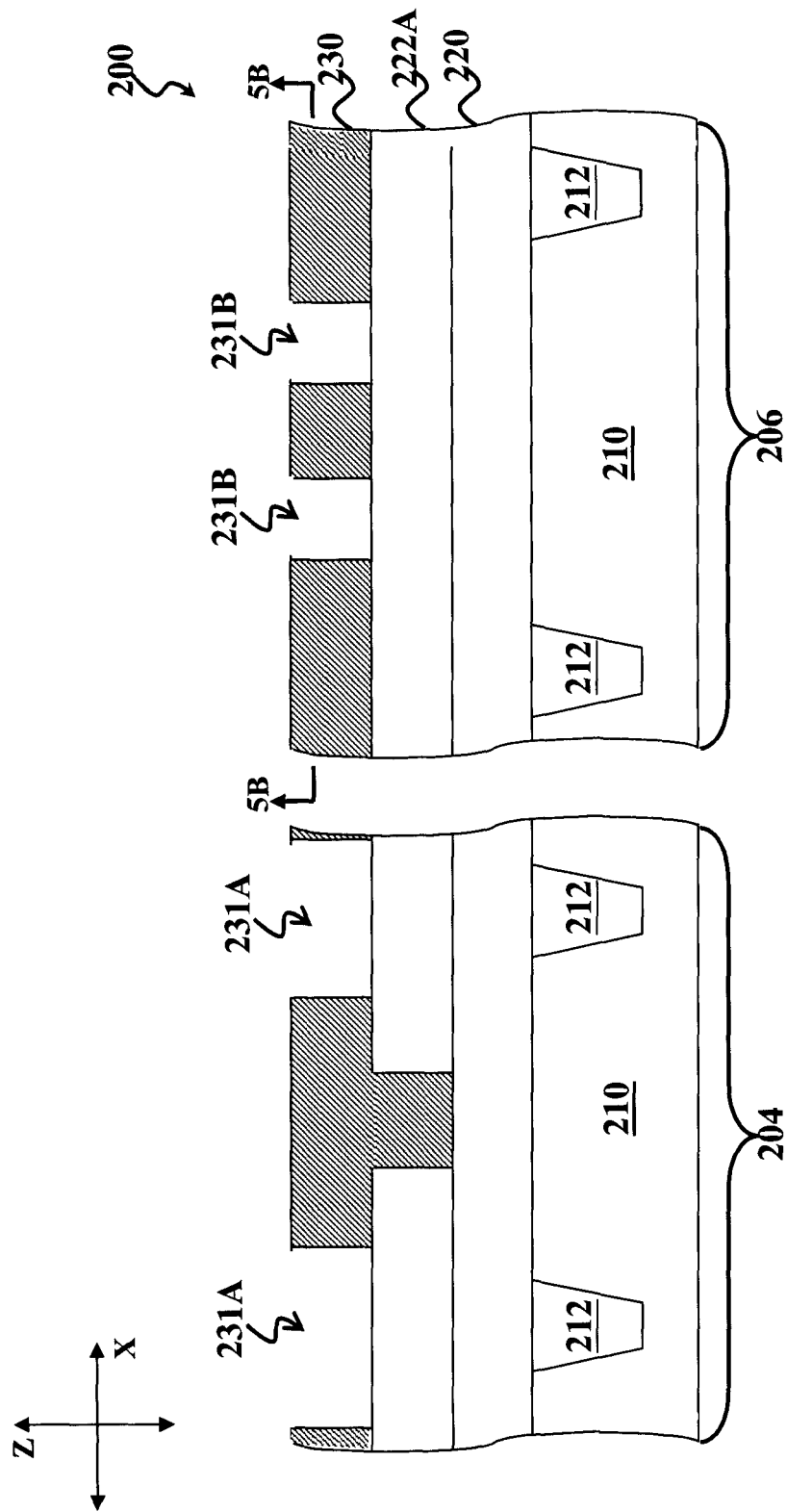
Figure 5B:
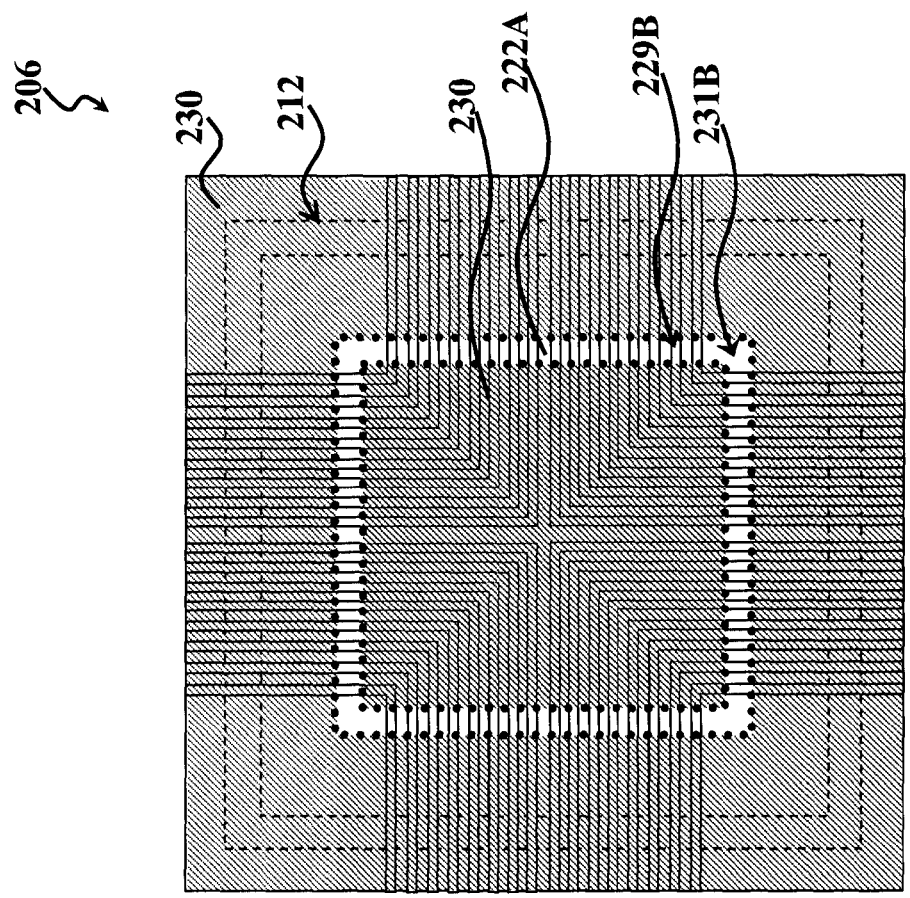
Figure 5B:
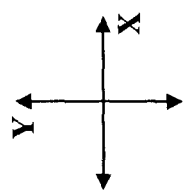

Referring to FIGS. 5A and 5B, a patterned photoresist layer 230 is disposed over the hard mask layer having the first pattern 222A. The patterned photoresist layer 230 fills the openings 229A and 229B. The patterned photoresist layer 230 includes openings 231A in the device region 204 and openings 231B in alignment region 206, such that portions of the hard mask layer having the first pattern 222A are exposed within the openings 231A and 231B. The openings 231A and 231B are configured according to a predetermined pattern. For example, in the depicted embodiment, the patterned photoresist layer 230 defines ends of the gate structures that will be formed for the integrated circuit device 200. The patterned photoresist layer 230 may be a positive-type or negative-type photoresist layer. The patterned photoresist layer 230 is formed by a photolithography process, which may include processing steps of photoresist coating (such as spin-on coating), soft baking, mask aligning, exposing, post-exposure baking, developing, hard baking, other suitable processes, or combinations thereof. In an example, the exposing process includes exposing the photoresist layer 224 to a radiation beam through a mask having the predefined (or predetermined) pattern (or a reversed pattern). The radiation beam may use ultraviolet (UV) or extreme ultraviolet (EUV) radiation. Alternatively, the exposing process is implemented or replaced by other proper methods, such as maskless lithography, electron-beam (e-beam) writing, ion-beam writing, and/or molecular imprint techniques.

Referring to FIG. 5B, in the depicted embodiment, a BIB pattern recognition technique is implemented to ensure alignment of the various layers of the integrated circuit device 200. For example, an overlay target is represented by an outer (open-centered) box formed by the isolation features 212 in the substrate 210, and an inner box formed by the opening 231B in the patterned photoresist layer 230. The outer box has a first range of dimensions, and the inner box has a second range of dimensions, such that there is a distance d between the boxes. Alternatively, the pattern recognition feature may be designed to include shapes other than boxes, including triangles, rectangles, circles, T-shapes, L-shapes, pluses, crosses, octagons, other suitable shapes, or combinations thereof. Further, the pattern recognition technique may utilize other overlay target designs, such as frame-in-frame, segmented-frame, advanced imaging metrology (AIM), and short vernier (SVNR).

In an exemplary pattern recognition method, the outer and inner boxes are exposed to radiation by a suitable generator known in the art. The radiation includes visible, invisible, fluorescent, and/or polarized (which may include a single mode or multiple mode) radiation. For example, the generator can include an invisible electromagnetic wave generator, which generates a variety of invisible electromagnetic waves, including X-ray, ultraviolet (UV), and/or deep ultraviolet (DUV) waves. It is further contemplated that the radiation may possess a single wavelength or multiple wavelengths. Reflective beams from the outer and inner box are then detected by an alignment detector, which may include a wavelength dispersive spectrometer, an energy dispersive spectrometer, and/or other detectors. When the reflective beams are detected, the locations of the outer and inner boxes may be identified. As a result, it can be determined whether the pattern of the layers disposed over the substrate are properly positioned. In the depicted embodiment, the sub-resolution dummy features exposed within the openings 231B are undetected by the pattern alignment system and provide improved contrast between the patterned photoresist layer 230 and hard mask layer having the first pattern 222A, such that the inner box is more easily detected by the alignment detector. The dummy features can easily be implemented into conventional processing, providing a cost-effective and time-conscious solution to enhancing overlay mark measurement signals, particularly in double patterning situations.

Figure 6A:
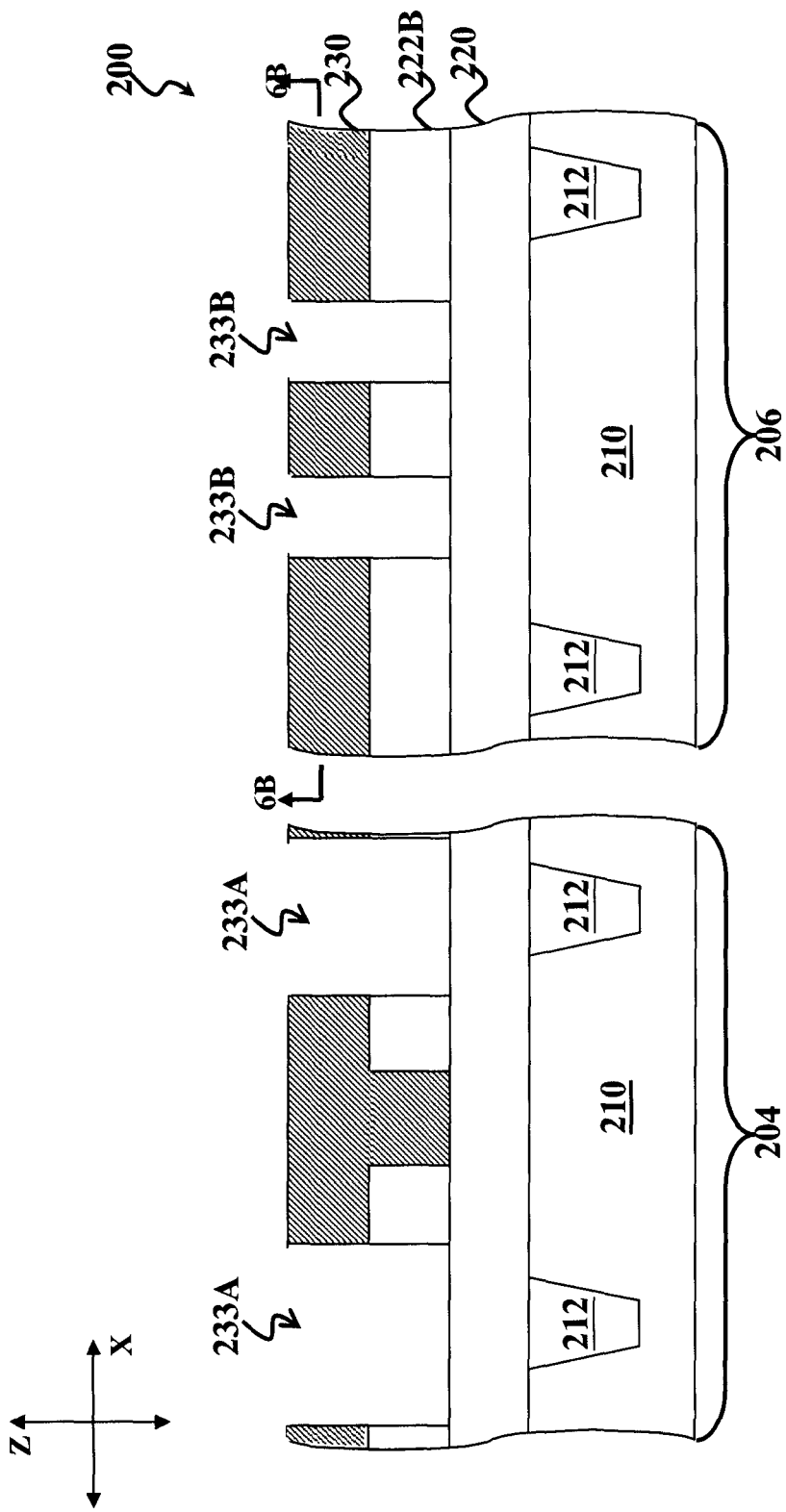
Figure 6B:
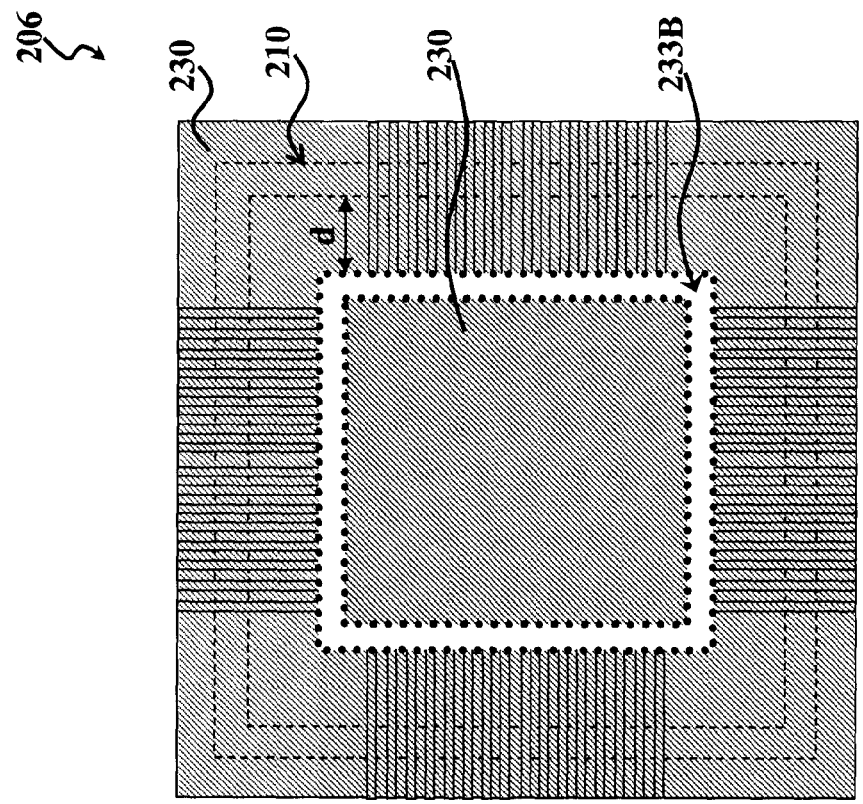
Figure 6B:
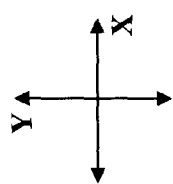

Referring to FIGS. 6A and 6B, the patterned photoresist layer 230 is used as a mask to pattern the hard mask layer having the first pattern 222A. For example, an etching process is performed to remove the portions of the hard mask layer having the first pattern 222A exposed within the openings 231A and 231B. The etching process is a dry etching process, wet etching process, other suitable etching process, or combinations thereof. The etching process extends the openings 231A and 231B into the hard mask layer having the first pattern 222A, thereby forming openings 233A in the device region 204 and openings 233B in the alignment region 206. Portions of the gate layer 220 are exposed within the openings 233A and 233B.

Figure 7A:
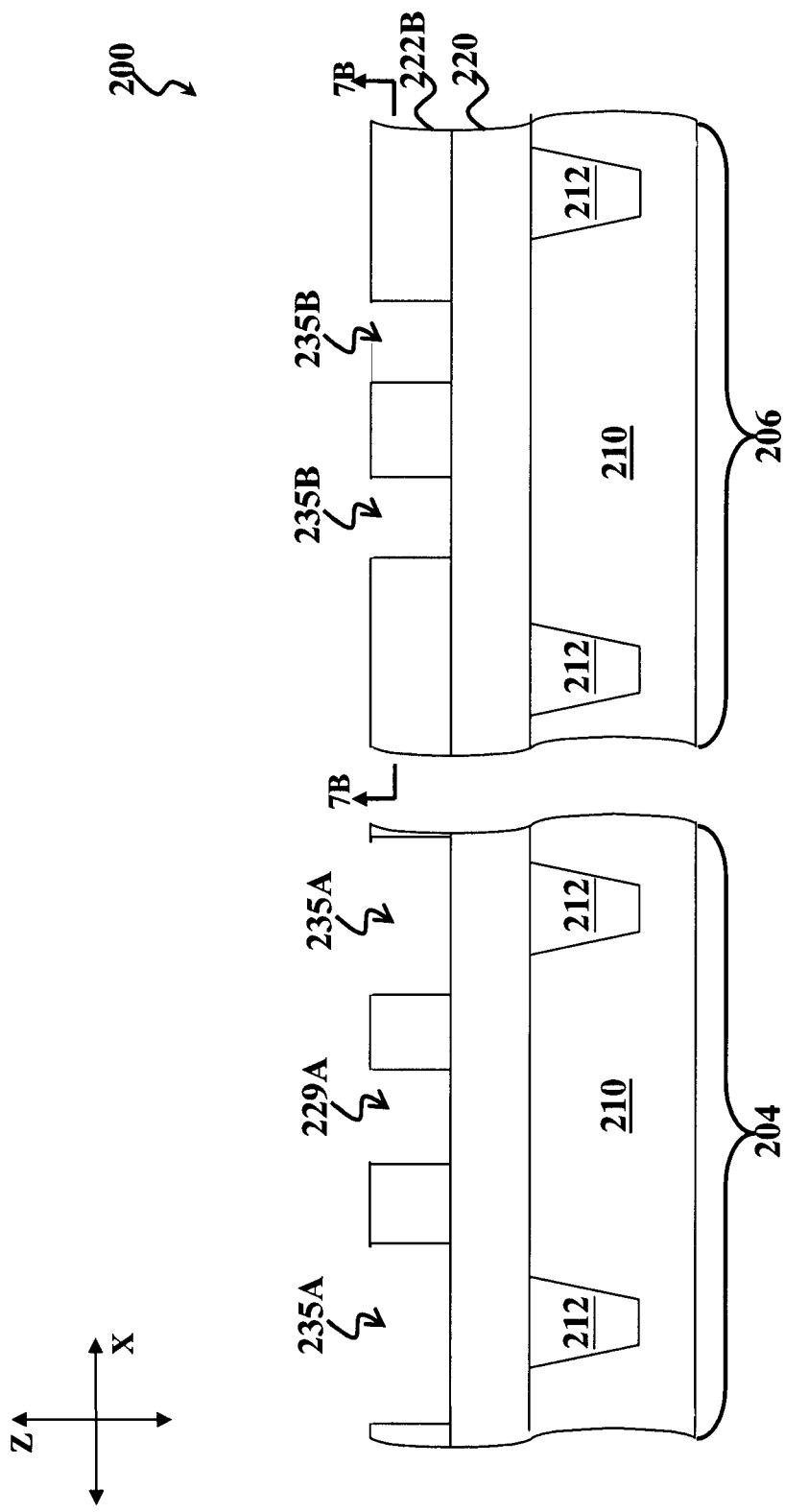
Figure 7B:
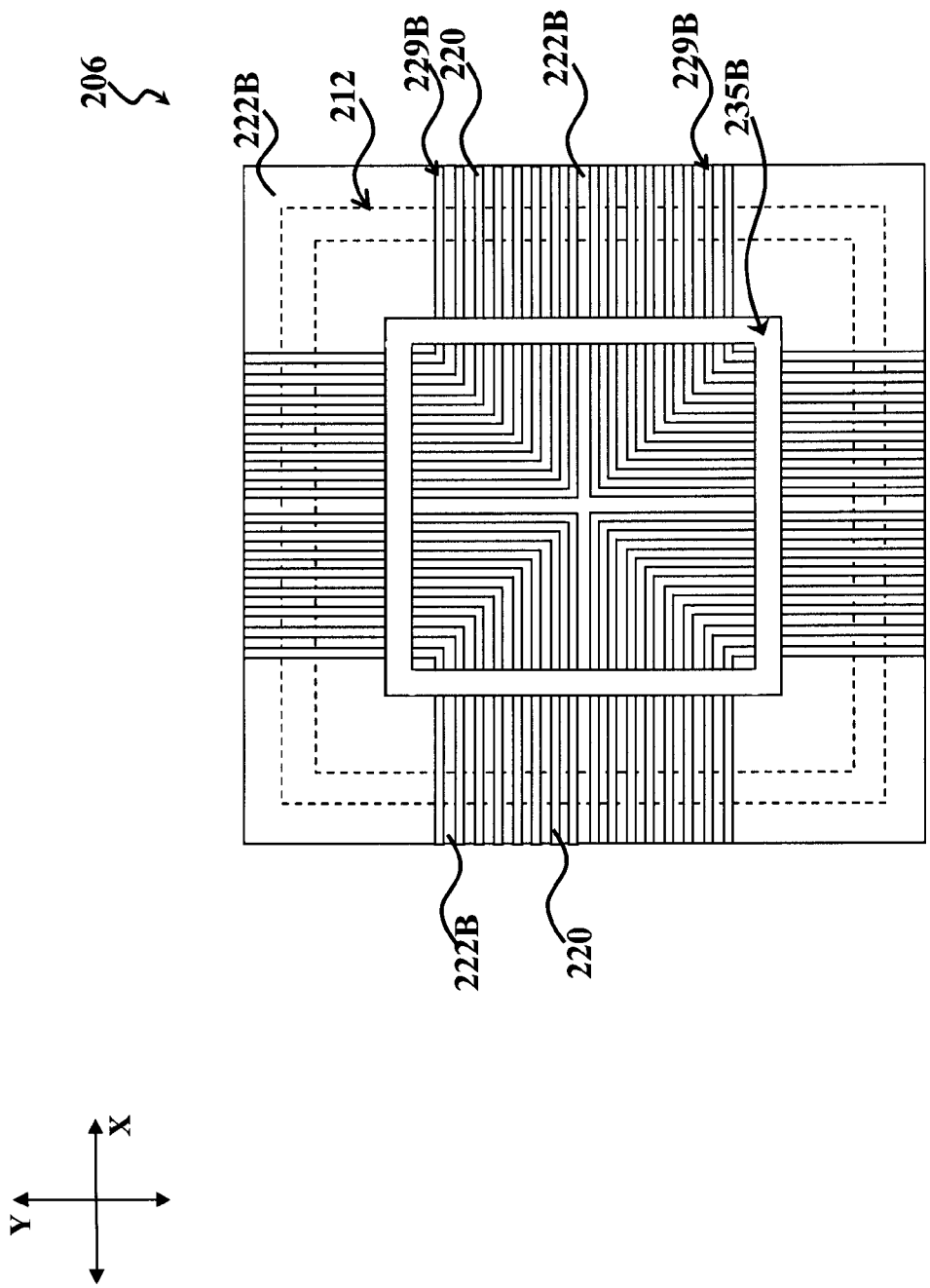

Thereafter, referring to FIGS. 7A and 7B, the patterned photoresist layer 230 is removed, for example, by a photoresist stripping process, leaving hard mask layer having a second pattern 222B. The hard mask layer having the second pattern 222A includes openings 229A and openings 235A in the device region 204, and openings 229B and openings 235B in the alignment region 206. The openings 235A and 235B modify the device features in the device region 204 and dummy features in the alignment region 206. More specifically, the openings 235A cut the gate lines into individual gate structures, and the openings 235B modify the alignment enhancement feature. The opening 235B forms a trench in the alignment region in the shape of a box. The box may be used as an outer box or an inner box during a BIB technique for aligning subsequently patterned layers.

Referring to FIGS. 6A, 6B, 7A, and 7B, the dummy features formed in the alignment region 206 can reduce etch loading effects. For example, in conventional processing, the exposed hard mask layer within the openings of the patterned photoresist layer 230 in the alignment region is a non-segmented hard mask material layer. Accordingly, due to a difference in pattern density in the device and alignment regions, the hard mask layer within the openings is often not completely etched away in the alignment regions to expose the gate layer 220. This leads to poor pattern contrast for the box formed in the alignment region, such as the box formed by the openings 235B in the alignment region 206. In contrast, in the depicted embodiment, because the hard mask layer 222 is divided into multiple, segmented material lines in the alignment region (forming the dummy features in the alignment region 206), the hard mask layer 222 within the openings 233B is completely removed, forming a clear alignment feature that can be used for aligning subsequently patterned layers.

Figure 8A:
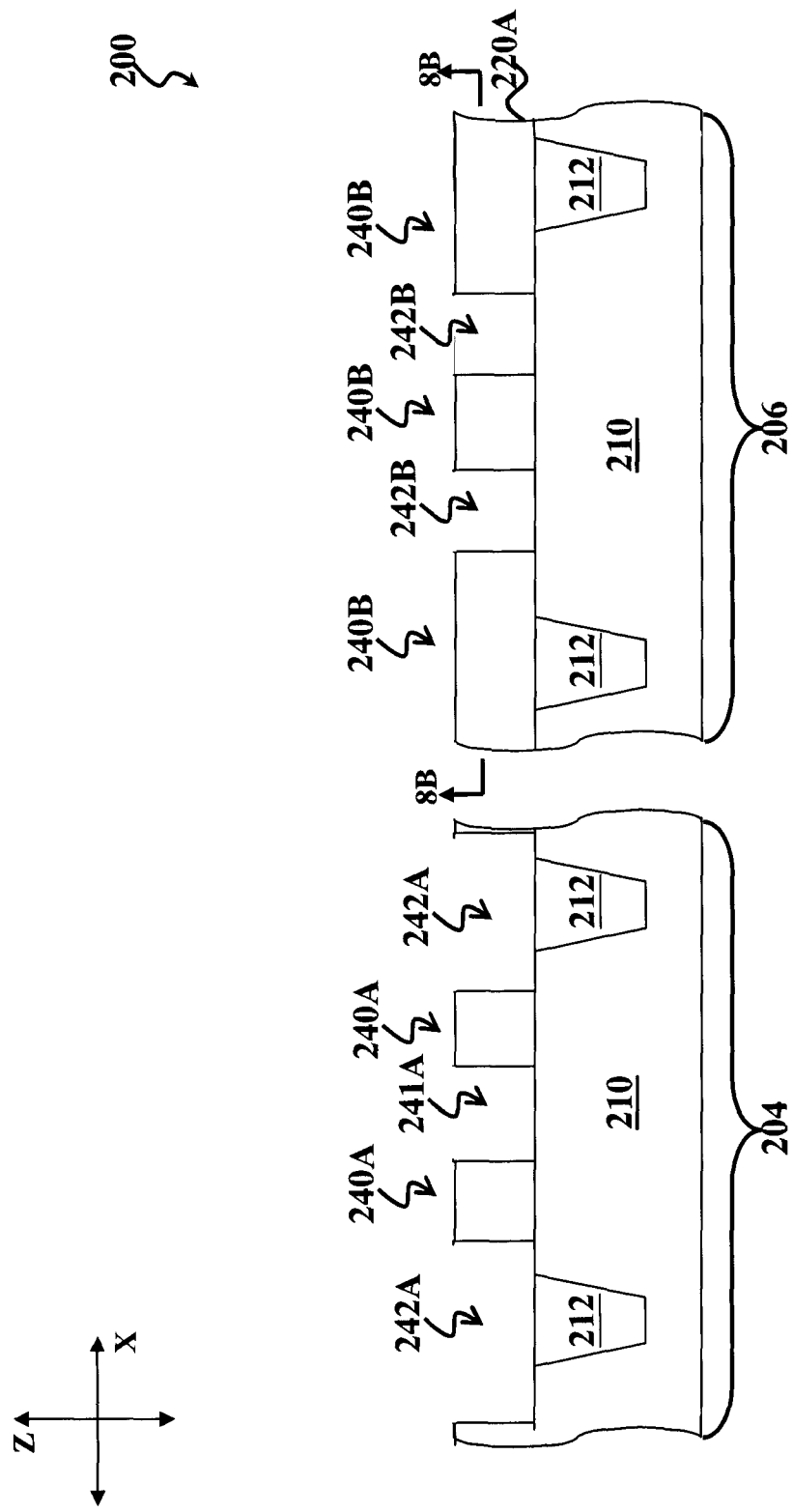
Figure 8B:
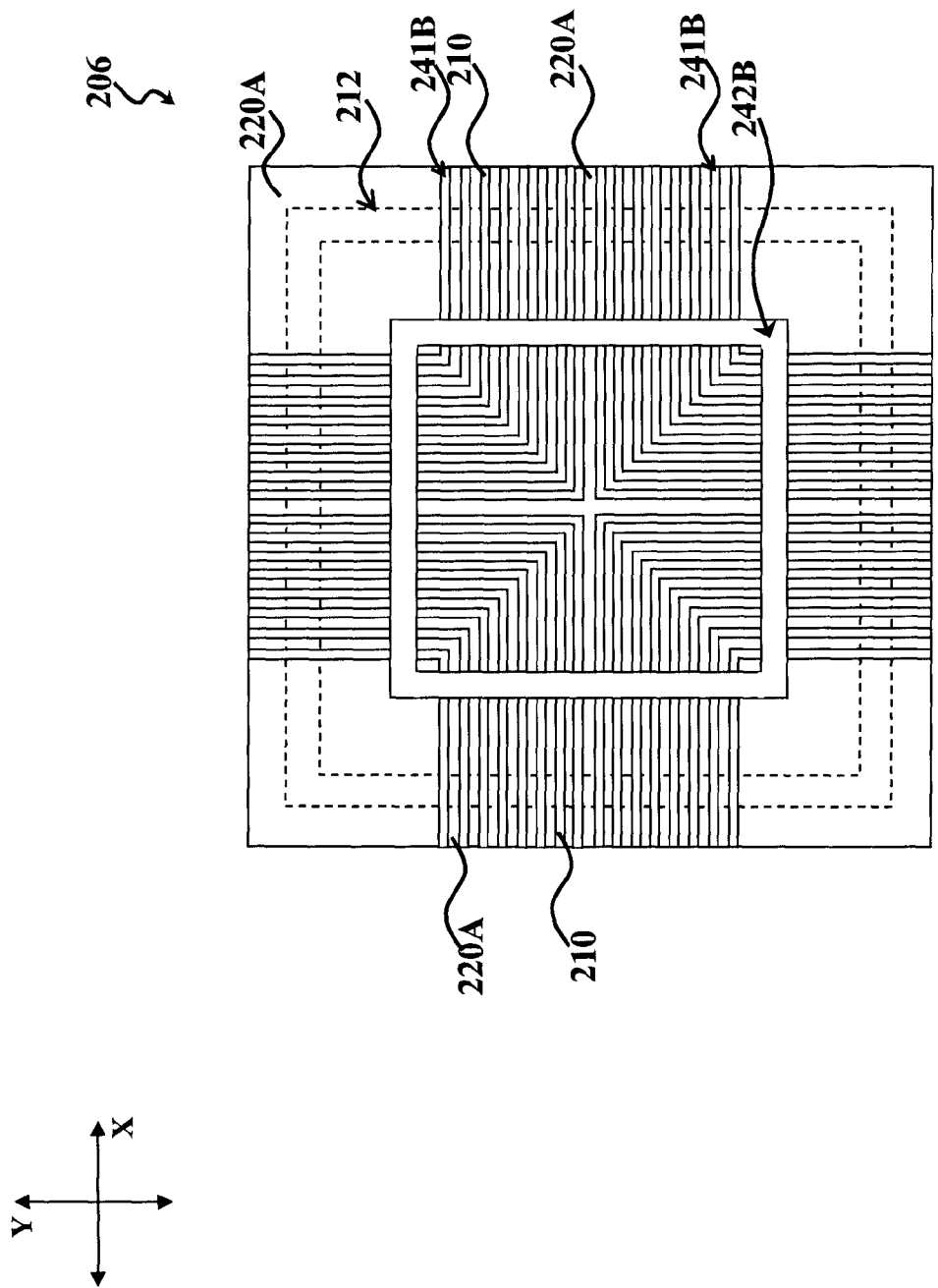

Referring to FIGS. 8A and 8B, the hard mask layer having the second pattern 222B is used as a mask to pattern the gate layer 220. For example, an etching process is performed to remove the portions of the gate layer 220 exposed within the openings 229A, 229B, 235A, and 235B, thereby forming patterned gate layer 220A. The etching process is a dry etching process, wet etching process, other suitable etching process, or combinations thereof. The etching process extends the openings 229A, 229B, 235A, and 235B into the gate layer 220. The patterned gate layer 220A includes gate structures, such as gate stacks 240A, and openings 241A and 242A in the device region 204, and dummy features 240B and openings 241B and 242B in the alignment region 206. The openings 242B form a box, which may be used as an outer box or an inner box during a BIB technique for aligning subsequently patterned layers. Alternatively, the pattern recognition feature may be designed to include shapes other than boxes, including triangles, rectangles, circles, T-shapes, L-shapes, pluses, crosses, octagons, other suitable shapes, or combinations thereof. Further, the pattern recognition technique may utilize other overlay target designs, such as frame-in-frame, segmented-frame, advanced imaging metrology (AIM), and short vernier (SVNR).

Figure 9A:
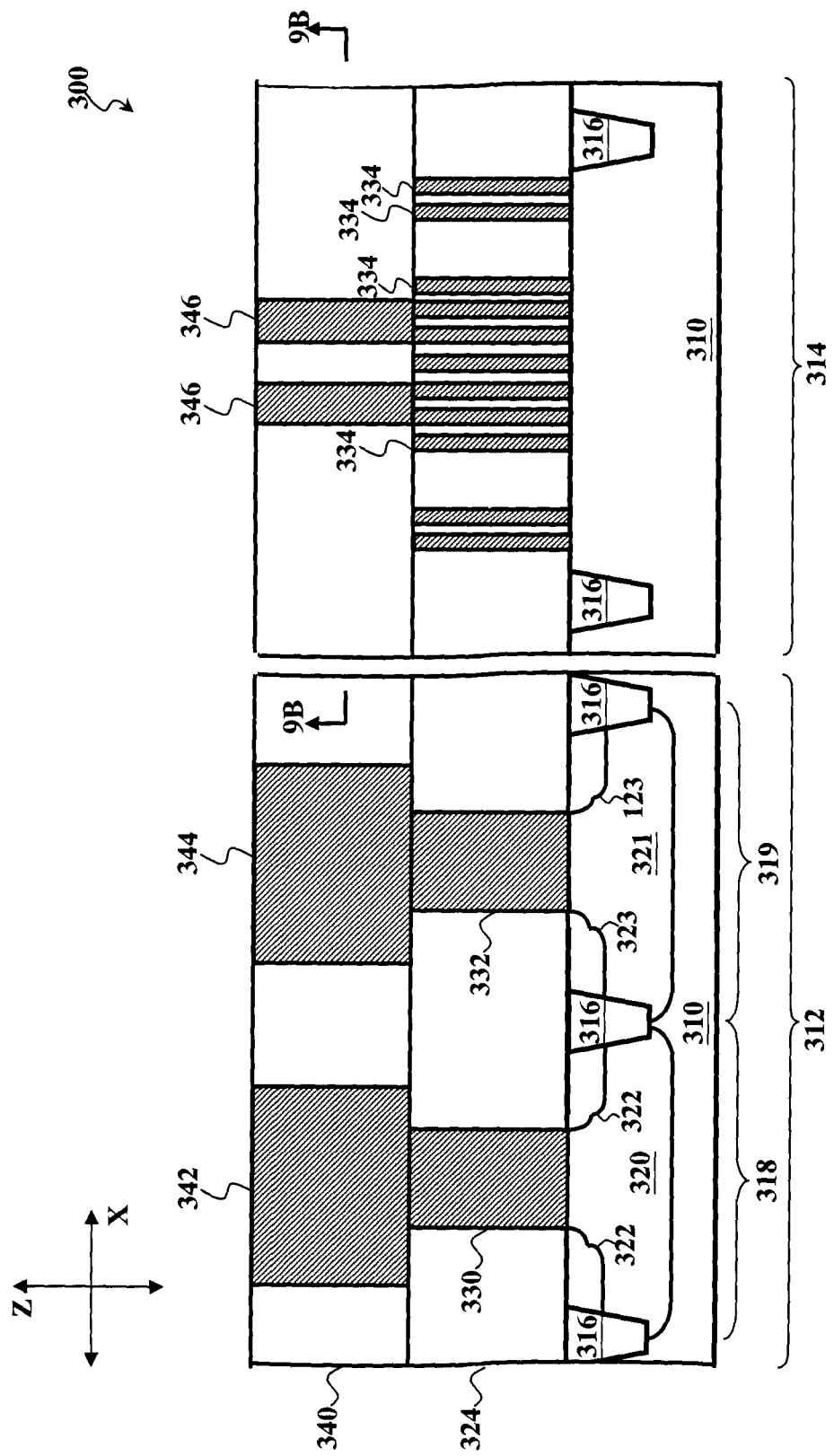
FIG. 9A is a diagrammatic cross-sectional view of an embodiment of an integrated circuit device having a pattern recognition feature in an integrated circuit alignment region of the integrated circuit device according to various aspects of the present disclosure.
Figure 9B:
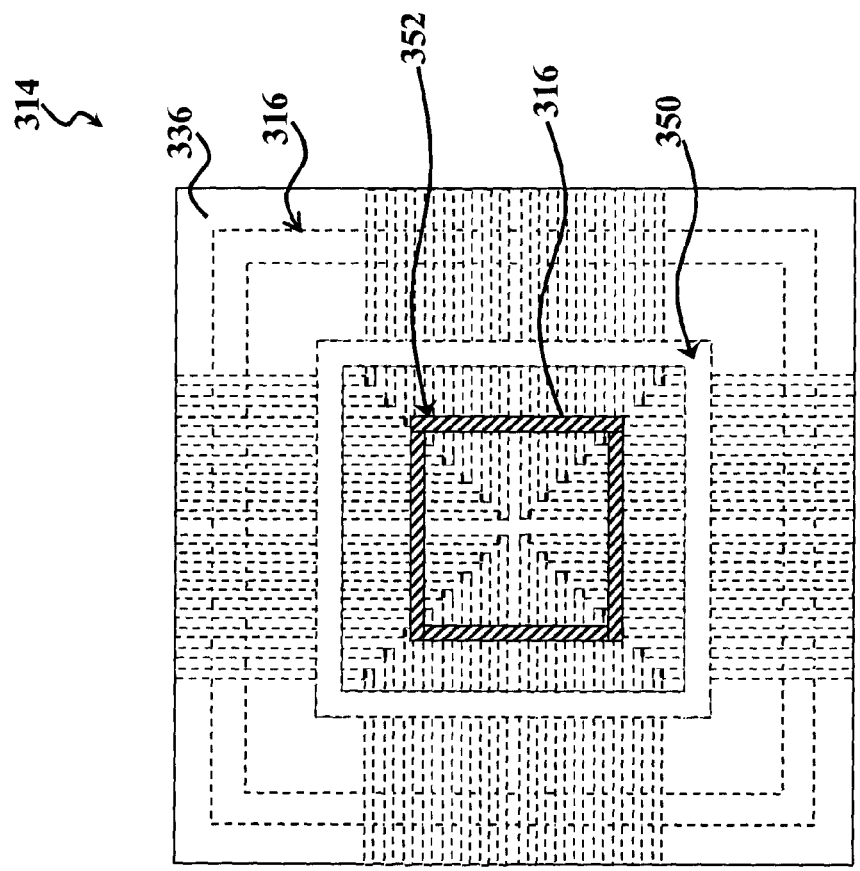
FIG. 9B is a top diagrammatic view of the integrated circuit device taken along line 9B-9B in FIG. 9A.

FIG. 9A is a diagrammatic cross-sectional view of an integrated circuit device 300 having a pattern recognition feature, and FIG. 9B is a diagrammatic top view of the integrated circuit device 300 taken along 9B-9B. The integrated circuit device 300 includes a substrate 310, such as a silicon substrate. Alternatively, the substrate 310 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 310 is a semiconductor on insulator (SOI). In other alternatives, semiconductor substrate 310 may include a doped epi layer, a gradient semiconductor layer, and/or a semiconductor layer overlying another semiconductor layer of a different type, such as a silicon layer on a silicon germanium layer.

The substrate 310 includes a device region 312 and an alignment region 314. The device region 312 may include a variety of integrated circuit devices, including active components, such as metal-oxide-semiconductor field effect transistors (MOSFETs), complementary metal-oxide-semiconductor transistors (CMOSs), high voltage transistors, and/or high frequency transistors; other suitable components; and/or combinations thereof. The device region 312 may additionally include passive components such as resistors, capacitors, inductors, and/or fuses. The alignment region 314 may include various pattern recognition features, including alignment marks, overlay marks, other suitable alignment features, or combinations thereof. The regions 312 and 314 will be further described below.

Isolation features 316 are formed in the substrate 310 to isolate various regions, such as the device region 312 and the alignment region 314, of the substrate 310. The isolation features 316 also isolate devices within the device region 312 from one another, such as devices 318 and 319. The isolation features 316 utilize isolation technology, such as local oxidation of silicon (LOCOS) and/or shallow trench isolation (STI), to define and electrically isolate the various regions. The isolation features 316 comprise silicon oxide, silicon nitride, silicon oxynitride, other suitable materials, or combinations thereof. The isolation features 316 are formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

In the depicted embodiment, the devices 318 and 319 are field-effect-transistors (FETs). The devices 318 and 319 include doped regions 320 and 321 that may be doped the same or differently. The doped regions 320 and 321 are n-type wells (n-well) or p-type wells (p-well) depending on device configuration. For example, the device 318 may be configured as an n-type FET (NFET), and the device 319 may be configured as a p-type FET (PFET). Accordingly, the doped region 320 is doped with a p-type doping species, and the doped region 121 is doped with an n-type doping species.

The devices 318 and 319 further include source and drain (S/D) regions 322 and 323. The S/D regions 322 and 323 can include lightly doped S/D (LDD) regions, heavily doped S/D (HDD) regions, or a combination thereof. The LDD regions may include halo/pocket implantations, and the HDD regions may include raised S/D regions. The S/D regions are formed in the substrate 310 by ion implantation processes, photolithography processes, diffusion processes, annealing processes (e.g., rapid thermal annealing and/or laser annealing processes), and/or other suitable processes. Raised S/D regions can be formed by an epitaxy process, such as a CVD deposition techniques (e.g., vapor-phase epitaxy (VPE) and/or ultra-high vacuum CVD (UHV-CVD)), molecular beam epitaxy, and/or other suitable processes. The doping species depends on the type of device being fabricated and includes p-type dopants, such as boron or $BF_2$; n-type dopants, such as phosphorus or arsenic; and/or combinations thereof. For example, the device 318 configured as an NFET device may include S/D regions 322 doped with n-type dopants, and the device 319 configured as a PFET device may include S/D regions 323 doped with p-type dopants. Though not depicted, in alternate embodiments, it is contemplated that doped regions and S/D regions may also be formed in the alignment region 314.

An inter-level dielectric (ILD) layer 324 is disposed over the substrate 310 in the device and alignment regions 312 and 314. The ILD layer 324 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 324 can include a multilayer structure having multiple dielectric materials.

Figure 9B:
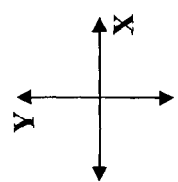

Gate stacks 330 and 332 are formed in the device region 312, and gate stacks 334 are formed in the alignment region 314. The number of gate stacks is not limited by the integrated circuit device 300, and can include more or less than that depicted in FIG. 9. In the depicted embodiment, the gate stacks 330, 332, and 334 are simultaneously formed, such that each gate stack 330, 332, and 334 comprises the same materials or layers. Alternatively, the gate stacks 330, 332, 334 may be formed by different processes or materials. The gate stacks comprise one or more material layers, including but not limited to interfacial layers, gate dielectric layers, high-k dielectric layers, capping layers, diffusion/barrier layers, conductive layers, other suitable layers, or combinations thereof.

In the depicted embodiment, the gate stacks include a gate dielectric layer (not shown) and a gate layer. The gate dielectric layer is formed over the substrate 310 and comprises a dielectric material, such as silicon oxide, silicon oxynitride, silicon nitride, a high-k dielectric material layer, other suitable dielectric materials, and/or combinations thereof. Exemplary high-k dielectric materials include $HfO_2$, HfSiO, HfSiON, HfTaO, HfTiO, HfZrO, other suitable high-k dielectric materials, and/or combinations thereof. The gate dielectric layer may include a multilayer structure. For example, the gate dielectric layer could include an interfacial layer, and a high-k dielectric material layer formed on the interfacial layer.

The gate layer is formed over the gate dielectric layer. In the present embodiment, the gate layer is a polycrystalline silicon (or polysilicon) layer. The polysilicon layer may be doped for proper conductivity. Alternatively, the polysilicon is not necessarily doped if a dummy gate is to be formed and is replaced in a subsequent gate replacement process. Alternatively, the gate layer could include a conductive layer having a proper work function, therefore, the gate layer can also be referred to as a work function layer. The work function layer comprises any suitable material, such that the layer can be tuned to have a proper work function for enhanced performance of the associated device. For example, if a P-type work function metal (P-metal) for a PMOS device is desired, TiN or TaN may be used. On the other hand, if an N-type work function metal (N-metal) for NMOS devices is desired, Ta, TiAl, TiAlN, or TaCN, may be used. The work function layer could include doped conducting oxide materials. The gate layer could include other conductive materials, such as aluminum, copper, tungsten, metal alloys, metal silicide, other suitable materials, and/or combinations thereof. For example, where the gate layer includes a work function layer, another conductive layer can be formed over the work function layer.

The gate stacks 330, 332, and 334 are formed by deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, or ion-beam writing. The etching processes include dry etching, wet etching, and/or other etching methods.

In the depicted embodiment, the gate stacks 330, 332, and 334 are formed by a double patterning process that includes a line-cut process and an end-cut process. For example, the gate stacks 330, 332, and 334 are formed similarly to the gate structures 240A and dummy features 240B illustrated in FIGS. 8A and 8B. The gate stacks 334 are configured to form an alignment mark, such as an overlay target. Referring to FIG. 9B, the gate stacks 334 are configured to form an overlay target for a box-in-box alignment technique. In the depicted embodiment, the gate stacks 334 are disposed in the ILD layer 324, such that a portion of the ILD layer 324 forms an outer (open-centered) box 350 of the pattern alignment feature.

Another ILD dielectric layer 340 is disposed over the ILD layer 324 in the device and alignment regions 312 and 314. The ILD layer 340 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 340 can include a multilayer structure having multiple dielectric materials.

Features 342 and 344 are formed in the device region 312, and features 346 are formed in the alignment region 314. In the depicted embodiment, the features 342 and 344 are contacts/vias/lines configured to connect the various features or structures of the integrated circuit device 300. The features 346 are configured to form an alignment mark in the alignment region 314. More specifically, in the depicted embodiment, the features 346 form an inner box (open-centered) box 352 of the pattern alignment feature. In the depicted embodiment, the features 342, 344, and 346 are simultaneously formed, such that each feature 342, 344, and 346 comprises the same materials or layers. Alternatively, the features 342, 344, and 346 may be formed by different processes or materials. In the depicted embodiment, the features 342, 344, and 346 comprise a conductive material, such as copper. The integrated circuit device 300 may further include a multilayer interconnection that includes vertical interconnects, such as vias or contacts, and horizontal interconnects, such as metal lines.

Many variations of the above example are contemplated by the present disclosure. For example, as noted above, the disclosed examples have been simplified for the sake of clarity to better understand the inventive concepts of the present disclosure. Any combination of dimensions, pitches, shapes, number of patterns, or area of patterns is contemplated for the sub-resolution dummy features. In some examples, a dummy feature is divided into multiple dummy features. In some examples, the overlay marks (for example, the outer or inner boxes) are divided into multiple material features to form the overlay marks. Any combination of the examples described herein is contemplated.

In summary, a sub-resolution dummy feature is implemented underneath an overlay mark (or alignment mark), such as an outer box of a box-in-box alignment pattern. The sub-resolution dummy feature can provide improved contrast between the materials forming the alignment mark and surrounding materials. The sub-resolution dummy features are particularly useful in double patterning techniques, where at least two lithography steps are used to pattern as single layer. The sub-resolution dummy features can also reduce etching loading effects. Because the dummy feature is sub-resolution, satisfactory pattern contrast and alignment detection can be maintained. Different embodiments may have different advantages than those described herein, and no particular advantage is necessarily required of any embodiment.

The present disclosure provides for many different embodiments. For example, a method includes providing a substrate having a device region and an alignment region; forming a first material layer over the substrate; forming a device feature and a dummy feature in the first material layer, wherein the device feature is formed in the device region and the dummy feature is formed in the alignment region, the device feature having a first dimension and the dummy feature having a second dimension, the second dimension being less than a resolution of an alignment mark detector; forming a second material layer over the first material layer; and forming an alignment feature in the second material layer, the alignment feature being disposed over the dummy feature in the alignment region. The dummy feature is a plurality of segmented material lines. The plurality of segmented material lines may be formed by forming a plurality of first material lines in a first direction and forming a plurality of second material lines in a second direction, the first direction traversing the second direction. The method may include forming an alignment feature in the substrate, the alignment feature in the substrate being an outer box of a box-in-box alignment pattern and the alignment feature in the second material layer being an inner box of the box-in-box alignment pattern.

In another example, a method includes providing a substrate having a device region and an alignment region; forming a material layer over the substrate; and performing a first lithography and etching process to form a device feature in the material layer in the device region and a dummy feature in the material layer in the alignment region, the dummy feature having a dimension that is less than a resolution of an alignment mark detector. The method further includes forming a photoresist layer over the material layer; and performing a second lithography process to form an alignment feature in the photoresist layer, the alignment feature being disposed over the dummy feature in the material layer. The method may further include forming an alignment feature in the substrate, the alignment feature in the substrate being an outer box of a box-in-box alignment pattern and the alignment feature in the photoresist layer being an inner box of the box-in-box alignment pattern.

Forming the material layer over the substrate may include forming a hard mask layer over the substrate. Performing the first lithography and etching process to form the device and dummy features may include forming a first photoresist layer over the hard mask layer; forming openings in the first photoresist layer, wherein the openings expose the hard mask layer in the alignment region; and removing the exposed portions of the hard mask layer, thereby forming first openings in the hard mask layer in the device region and second openings in the hard mask layer in the alignment region. Further, forming the photoresist layer over the material layer may include forming a second photoresist layer over the hard mask layer, performing the second lithography process to form the alignment feature may include forming openings in the second photoresist layer, wherein the openings expose the hard mask layer, and including removing the exposed portions of the hard mask layer, thereby forming third openings in the hard mask layer in the device region and fourth openings in the hard mask layer in the alignment region. The method may further include forming a third material layer between the substrate and the hard mask layer, the third material layer being exposed by the first, second, third, and fourth openings in the hard mask layer; and removing the exposed third material layer.

In yet another example, an integrated circuit device includes a semiconductor substrate having a device region and an alignment region; a first material layer disposed over the semiconductor substrate, the first material layer including a device feature in the device region and a dummy feature in the alignment region, wherein a dimension of the dummy feature is less than a dimension of an alignment detector; and a second material layer disposed over the semiconductor substrate, the second material layer including an alignment feature in the alignment region, the alignment feature disposed over the dummy feature. The device feature has a first width and the dimension of the dummy feature is a second width, the second width being less than the first width. The alignment feature may be an inner box of a box-in-box alignment pattern, and the substrate may include an alignment feature that is an outer box of the box-in-box alignment pattern.

The foregoing outlines features of several embodiments so that those skilled in the art may better understand the aspects of the present disclosure. Features illustrated and discussed above with respect to some embodiments can be combined with features illustrated and discussed above with respect to other embodiments. Those skilled in the art should appreciate that they may readily use the present disclosure as a basis for designing or modifying other processes and structures for carrying out the same purposes and/or achieving the same advantages of the embodiments introduced herein. Accordingly, all such modifications are intended to be included within the scope of this disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
a semiconductor substrate having a device region and an alignment region;
a first material layer disposed over the semiconductor substrate, the first material layer including a device feature in the device region and a dummy feature in the alignment region; and
a second material layer disposed over the semiconductor substrate, the second material layer including an alignment feature in the alignment region, the alignment feature disposed over the dummy feature, wherein a dimension of the dummy feature is less than a dimension of the alignment feature, wherein the alignment feature is an inner box of a box-in-box alignment pattern; and the substrate includes an alignment feature that is an outer box of the box-in-box alignment pattern and wherein the alignment feature that is the outer box is an isolation trench disposed in the substrate.

2. The integrated circuit device of claim 1 wherein the alignment feature is an overlay mark.

3. The integrated circuit device of claim 1 wherein the device feature has a first width and the dimension of the dummy feature is a second width, the second width being less than the first width.

4. An integrated circuit device comprising:
a substrate having a device region and an alignment region;
a first material layer over the substrate;
a device feature and a dummy feature in the first material layer, wherein the device feature is formed in the device region and the dummy feature is formed in the alignment region, the device feature having a first dimension and the dummy feature having a second dimension, the second dimension being less than a resolution of an alignment mark detector;
a second material layer over the first material layer; and
an alignment feature in the second material layer, the alignment feature being disposed over the dummy feature in the alignment region, wherein the dummy feature includes forming a plurality of segmented material lines.

5. The integrated circuit device of claim 4 wherein the plurality of segmented material lines includes a plurality of first material lines in a first direction and a plurality of second material lines in a second direction, the first direction traversing the second direction.

6. The integrated circuit device of claim 4 wherein the alignment feature includes a box of a box-in-box alignment pattern.

7. The integrated circuit device of claim 6 wherein the box of the box-in-box alignment pattern includes a trench in the second material layer.

8. The integrated circuit device of claim 7 wherein the trench in the second material layer includes:
a portion of the dummy feature; and
the exposed portion of the dummy feature.

9. The integrated circuit device of claim 4 including an alignment feature in the substrate, the alignment feature in the substrate being an outer box of a box-in-box alignment pattern and the alignment feature in the second material layer being an inner box of the box-in-box alignment pattern.

10. An integrated circuit device comprising:
a substrate having a device region and an alignment region;
a material layer over the substrate;
a device feature patterned and etched into the material layer in the device region and a dummy feature patterned and etched into the material layer in the alignment region, the dummy feature having a dimension that is less than a resolution of an alignment mark detector; and
a patterned alignment feature in the substrate, the alignment feature in the substrate being an outer box of a box-in-box alignment pattern, wherein the dummy feature includes a plurality of segmented material lines.

* * * * *